United States Patent
Gaggl et al.

(10) Patent No.: US 11,099,213 B2
(45) Date of Patent: Aug. 24, 2021

(54) READOUT CIRCUIT FOR RESISTIVE AND CAPACITIVE SENSORS

(71) Applicant: Infineon Technologies AG, Neubiberg (DE)

(72) Inventors: Richard Gaggl, Poertschach am (AT); Andrea Baschirotto, Alessandria (IT); Cesare Buffa, Villach (AT); Fulvio Ciciotti, Milan (IT)

(73) Assignee: INFINEON TECHNOLOGIES AG, Munich (DE)

( * ) Notice: Subject to any disclaimer, the term of this patent is extended or adjusted under 35 U.S.C. 154(b) by 358 days.

(21) Appl. No.: 15/789,199

(22) Filed: Oct. 20, 2017

(65) Prior Publication Data

US 2019/0120879 A1  Apr. 25, 2019

(51) Int. Cl.
| | |
|---|---|
| *G01R 15/00* | (2006.01) |
| *G01R 27/02* | (2006.01) |
| *G01R 1/30* | (2006.01) |
| *G01R 27/26* | (2006.01) |

(52) U.S. Cl.
CPC ............ *G01R 15/005* (2013.01); *G01R 1/30* (2013.01); *G01R 27/02* (2013.01); *G01R 27/2605* (2013.01)

(58) Field of Classification Search
CPC .. G01R 27/2605; G01R 27/02; G01R 15/005; G01R 1/30
USPC .......................................... 324/658–690, 691
See application file for complete search history.

(56) References Cited

U.S. PATENT DOCUMENTS

| | | | |
|---|---|---|---|
| 4,103,249 A | 7/1978 | Burdick | |
| 5,854,564 A | 12/1998 | Darmawaskita et al. | |
| 2004/0011126 A1* | 1/2004 | Otto ...................... | G01F 23/284 73/290 R |
| 2010/0001746 A1* | 1/2010 | Duchene .............. | H03K 17/955 324/676 |
| 2011/0012618 A1* | 1/2011 | Teterwak ................. | G01D 5/24 324/607 |
| 2011/0199673 A1* | 8/2011 | Okaura ................ | G11B 7/1263 359/344 |
| 2013/0049760 A1* | 2/2013 | Ono ..................... | H03K 17/102 324/427 |

(Continued)

FOREIGN PATENT DOCUMENTS

RU     2603937     * 12/2016     ............. G01R 27/26

OTHER PUBLICATIONS

Barrettino, D. et al.; "A Single-Chip CMOS Micro-Hotplate Array for Hazardous-Gas Detection and Material Characterization"; Swiss Federal Institute of Technology Zurich, Switzerland; ISSCC 2004/ Session 17/MEMS and Sensors/ 17.2; Feb. 18, 2004; 8 pages.

(Continued)

*Primary Examiner* — Jeff W Natalini
(74) *Attorney, Agent, or Firm* — Slater Matsil, LLP

(57) ABSTRACT

A readout circuit for resistive and capacitive sensors includes a first input coupled to a reference resistor in a first mode of operation and coupled to a resistive sensor in a second mode of operation; a second input coupled to a capacitive sensor in the first mode of operation and coupled to a reference capacitor in the second mode of operation; and an output for providing a capacitive sensor data stream in the first mode of operation and for providing a resistive sensor data stream in the second mode of operation.

10 Claims, 5 Drawing Sheets

(56) References Cited

U.S. PATENT DOCUMENTS

| | | | | |
|---|---|---|---|---|
| 2013/0219245 | A1* | 8/2013 | Alexeyev | G06N 7/005 |
| | | | | 714/763 |
| 2014/0218334 | A1* | 8/2014 | Shibata | G06F 3/044 |
| | | | | 345/174 |
| 2018/0049469 | A1* | 2/2018 | Kaufman | G01D 5/24 |
| 2019/0095002 | A1* | 3/2019 | Bohannon | G06F 3/0418 |

OTHER PUBLICATIONS

Barrettino, D. et al.; "A Single-Chip CMOS Micro-Hotplate Array for Hazardous-Gas Detection and Material Characterization"; Swiss Federal Institute of Technology Zurich, Switzerland; ISSCC 2004/Session 17/MEMS and Sensors/17.2; 8 pages.

Ciciotti, F. et al.; "A MOX Gas Sensors Resistance-to-Digital CMOS Interface with 8-bits Resolution and 128dB Dynamic Range for Low-Power Consumer Applications"; Department of Physics, Univerity of Milano-Bicocca, Piazza Scienza, 20126 Milano, Italyp Prime 2017, Giardini Naxos-Taormina, Italy, 4 pages.

Ciciotti. F. et al.; "System Optimization and Design of a CMOS Low-Power ASIC for MOX Gas Sensors"; Department of Physics University of Milano-Bicocca, Piazza Scienza, 20126 Milano, Italy; 5 pages.

De Marcellis, A. et al.; "A CMOS Integrable Oscillator-Based Front End for High-Dynamic-Range Resistive Sensors"; IEEE Transactions on Instrumentation and Measurement, vol. 57, No. 8, Aug. 2008; 9 pages.

Flammini, A. et al.; "A Low-Cost Interface to High-Value Resistive Sensors Varying Over a Wide Range"; IEEE Transactions of Instrumentation and Measurement, vol. 53, No. 4, Aug. 2004; 5 pages.

Gardner, J.W., et al.; "CMOS Interfacing for Integrated Gas Sensors: A Review"; IEEE Sensors Journal, vol. 10, No. 12, Dec. 2010; 16 pages.

Grassi, M. et al.; "A 160 dB Equivalent Dynamic Range Auto-Scaling Interface for Resistive Gas Sensors Arrays"; IEEE Journal of Solid-State Circuits, vol. 42, No. 3, Mar. 2007; 11 pages.

Grassi, M. et al.; "A 141-dB Dynamic Range CMOS Gas-Sensor Interface Circuit Without Calibration with 16-Bit Digital Output Word"; IEEE Journal of Solid-State Circuits, vol. 42, No. 7, Jul. 2007; 12 pages.

Lemink, M. et al.; "A Three-Axis Micromachined Accelerometer with a CMOS Position-Sense Interface and Digital Offset-Trim Electronics"; IEEE Journal of Solid-State Circuits, vol. 34, No. 4, Apr. 1999; 13 pages.

Reverter, Ferran, "The Art of Directly Interfacing Sensors to Microcontrollers," Journal of Low Power Electronics and Applications, vol. 2, ISSN 2079-9268, www.mdpi.com/journal/jlpea, Nov. 2012, pp. 265-281.

"Universal Transducer Interface," Sensors Smartec, www.smartec-sensors.com/cms/media/datasheets/UTI%20interface/UTI_datasheet, Dec. 22, 2016, 27 pages.

Van Der Goes, Frank M. L., et al., "A Universal Transducer Interface for Capacitive and Resistive Sensor Elements," Analog Integrated Circuits and Signals Processing, vol. 14, Jan. 1997, pp. 249-260.

Wang, Guijie et al., "Smart measurement system for resistive (bridge) or capacitive sensors," SPIEDigitalLibrary.org/conference-proceedings-of-spie, 5th Annual International Symposium on Smart Structures and Materials, Jul. 20, 1998, 6 pages.

* cited by examiner

READOUT CIRCUIT FOR RESISTIVE AND CAPACITIVE SENSORS

TECHNICAL FIELD

The present invention relates generally to a readout circuit for resistive and capacitive sensors.

BACKGROUND

A trend in modern consumer electronics is to integrate numerous different sensors (pressure, temperature, gas, humidity, and microphones, for example) in a single device. Each sensor is based on different physical principles that translate different electrical quantities to be detected (mainly resistance and capacitance). The corresponding readout electronics must be adapted to each sensor, which means that different analog readout systems must be designed and implemented, increasing production costs, and device power consumptions.

Capacitive sensors are typically coupled to high-ohmic readout interfaces, switched-capacitors amplifiers or charge sensing amplifiers.

Resistive sensors are typically coupled to readout circuitry based on simple voltage dividers and Wheatstone bridge structures when the sensing resistance has a small variation. Resistive sensors are typically coupled to readout circuitry based on a multi-scale approach and resistance-to-frequency conversion systems when the resistance has a larger variation.

SUMMARY

According to the present invention, embodiments allow the readout of both resistive and capacitive sensors using the same readout channel and circuit. This makes the interface very versatile and particularly suitable for a portable device where multiple different sensors have to coexist (for example, modern smartphones).

For both the readout of resistive and capacitive sensors, the interface is able to convert the sensing element value in a digital output by performing resistance-to-time and/or capacitance-to-time conversions.

Working in the time domain allows to trade-off conversion time with dynamic range and resolution, which are far more important in the measurement of physical sensors, since environmental phenomena to be detected (gas concentration, pressure, temperature) have slow time variations.

The interface according to embodiments also exploits a multiplexed architecture to connect different resistive sensing elements while avoiding the typical drawbacks introduced by multiplexers (Ron and Roff of the multiplexer switches), and in combination with the very wide range of resistors that can be converted, makes the interface very versatile and compatible with many different sensors.

The readout circuitry according to embodiments benefits from scaled technology, with a consequent reduction of the Application Specific Integrated Circuit (ASIC) size and therefore fitting smaller packages (even on the same size of the Micro-Electro-Mechanical Systems (MEMS) or sensors used).

According to embodiments, the readout circuit can be used with multiple integrated sensors on the same die and the readout circuit architecture is compatible with several types of sensing elements (both capacitive and resistive). Examples include microphone, pressure, gas, humidity, as well as other such sensors.

The high flexibility of the readout circuit according to embodiments allows the readout of both resistive and capacitive sensors using the same readout channel and circuit. Different sensors with different electrical variations can be converted in the digital domain because of the wide dynamic range supported by the time conversion.

In a first embodiment, a readout circuit includes a first input coupled to a reference resistor in a first mode of operation and coupled to a resistive sensor in a second mode of operation; a second input coupled to a capacitive sensor in the first mode of operation and coupled to a reference capacitor in the second mode of operation; and an output for providing a capacitive sensor data stream in the first mode of operation and for providing a resistive sensor data stream in the second mode of operation. The readout circuit includes a voltage-to-current converter coupled to the first input, wherein the voltage-to-current converter comprises an amplifier coupled to a first current mirror portion in the first mode of operation and coupled to a second current mirror portion in the second mode of operation. The readout circuit includes an integrator coupled to the voltage-to-current converter and the second input, wherein the integrator comprises an amplifier coupled to first and second switches configured in a first position in the first mode of operation and configured in a second position in the second mode of operation. The readout circuit includes a logic circuit coupled to the integrator and to the output, wherein the logic circuit comprises a first comparator having a first threshold voltage coupled to a second comparator having a second threshold voltage.

In a second embodiment, an integrated circuit includes a first input pin for coupling to a resistor; a second input pin for coupling to a capacitor; and an output pin configured to provide a data stream corresponding to a value of the capacitor in a first mode of operation and for providing a data stream corresponding to a value of the resistor in a second mode of operation. The integrated circuit includes a voltage-to-current converter coupled to the first input, wherein the voltage-to-current converter comprises an amplifier coupled to a first current mirror portion in the first mode of operation and coupled to a second current mirror portion in the second mode of operation. The integrated circuit includes an integrator coupled to the voltage-to-current converter and the second input, wherein the integrator comprises an amplifier coupled to first and second switches configured in a first position in the first mode of operation and configured in a second position in the second mode of operation. The integrated circuit includes a logic circuit coupled to the integrator and to the output, wherein the logic circuit comprises a first comparator having a first threshold voltage coupled to a second comparator having a second threshold voltage.

In a third embodiment, a method of operating a readout circuit includes coupling a resistor and a capacitive sensor to first and second inputs of the circuit in a first mode of operation; coupling a capacitor and a resistive sensor to first and second inputs of the circuit in a second mode of operation; providing a capacitive sensor data stream at an output in the first mode of operation; and providing a resistive sensor data stream at the output in a the second mode of operation. The method includes selecting the capacitive sensor from a plurality of capacitive sensors resident in the device and/or selecting the resistive sensor from a plurality of resistive sensors resident in the device. The method can also include integrating the resistive sensor and the circuit together in an integrated circuit and/or integrating the capacitive sensor and the circuit together in an integrated circuit. The method includes providing at least one of the capacitive sensor data stream and the resistive data stream as a serial data stream.

BRIEF DESCRIPTION OF THE DRAWINGS

For a more complete understanding of the invention, and the advantages thereof, reference is now made to the following descriptions taken in conjunction with the accompanying drawings, in which.

DETAILED DESCRIPTION OF ILLUSTRATIVE EMBODIMENTS

Figure 1:
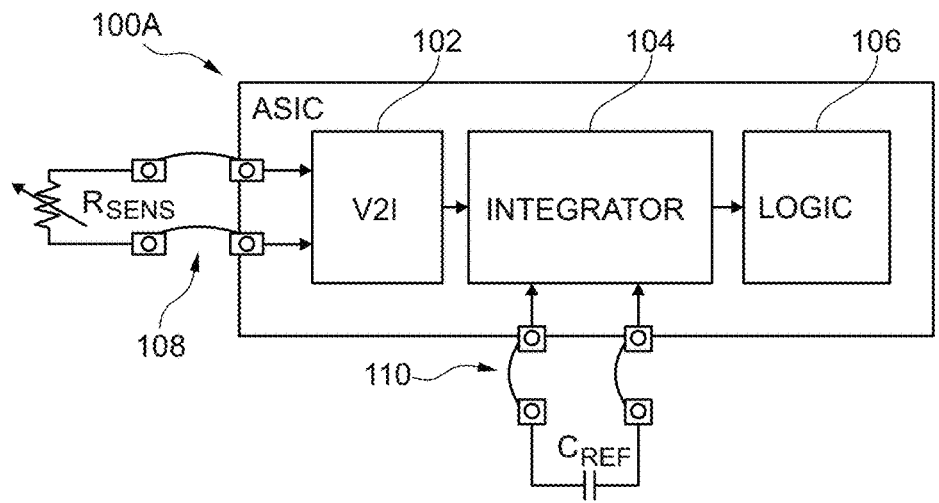
FIGS. 1-3 are block diagram of ASIC integrated circuits according to embodiments.

FIG. 1 shows an ASIC 100A including in pertinent part a voltage-to-current converter 102 coupled to an integrator 104, which is in turn coupled to a logic circuit 106 as will be described in further detail below. In a first mode of operation a two node input 108 is coupled to a variable resistor $R_{SENS}$, which represents a resistive sensor, and a two node input 110 is coupled to a fixed capacitor $C_{REF}$, which represents a capacitive reference. ASIC 100A is thus configured for reading out the data based on the resistive variations of the resistive sensor.

Figure 2:
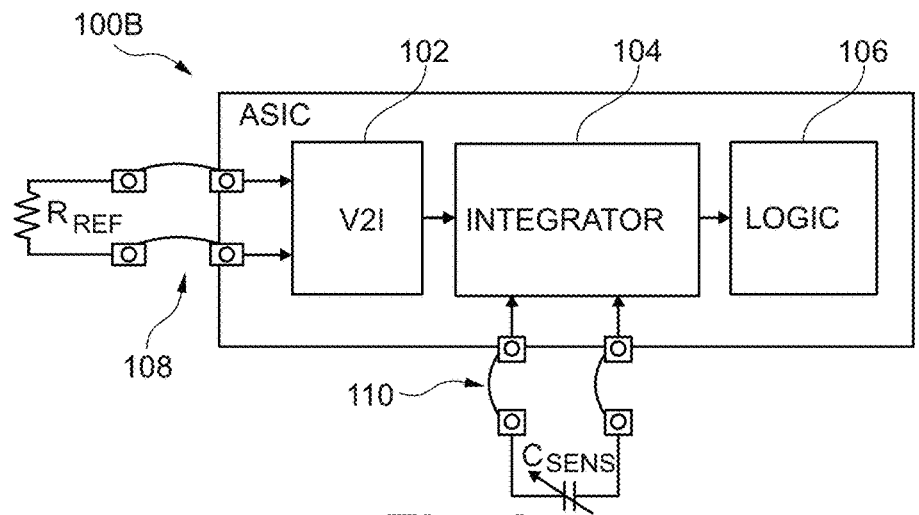

FIG. 2 shows an ASIC 100B including in pertinent part a voltage-to-current converter 102 coupled to an integrator 104, which is in turn coupled to a logic circuit 106 as will be described in further detail below. In a second mode of operation a two node input 108 is coupled to a fixed resistor $R_{REF}$, which represents a resistive reference, and a two node input 110 is coupled to a variable capacitor $C_{SENS}$, which represents a capacitive sensor. ASIC 100B is thus configured for reading out data based on the capacitive variations of the capacitive sensor.

Figure 3:
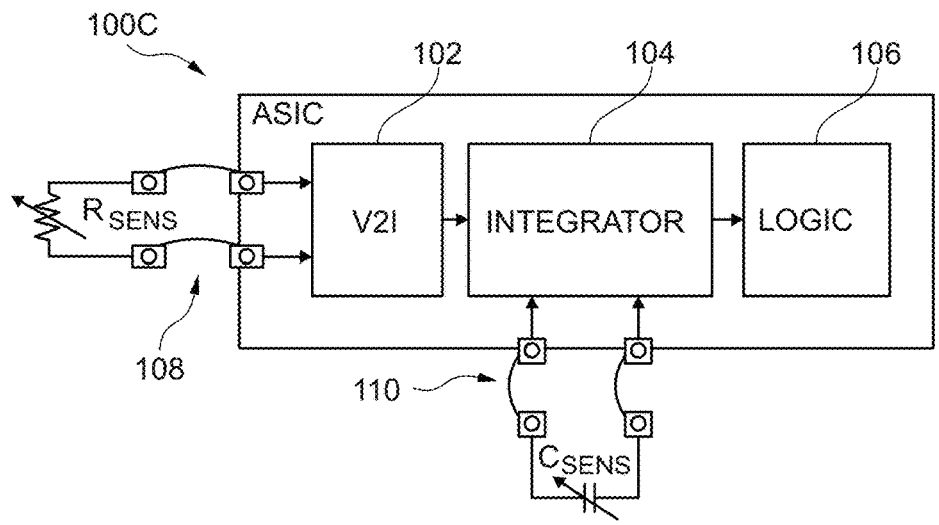

FIG. 3 shows an ASIC 100C including in pertinent part a voltage-to-current converter 102 coupled to an integrator 104, which is in turn coupled to a logic circuit 106 as will be described in further detail below. In a third mode of operation a two node input 108 is coupled to a variable resistor $R_{SENS}$, which represents a resistive sensor, and a two node input 110 is coupled to a variable capacitor $C_{SENS}$, which represents a capacitive sensor. Both sensors are coupled to ASIC readout circuit at the same time in an embodiment. ASIC 100C is thus configured for reading out composite serial data based on the resistive variations of the resistive sensor and on the capacitive variations of the capacitive sensor. The third mode of operation may be used for example, in capacitive and resistive sensors that have non-overlapping response characteristics. The non-overlapping response characteristic can be viewed as the first sensor acting as a reference for the second sensor in, for example, a first frequency range, and the second sensor acting as a reference for the first sensor in, for example, a second non-overlapping frequency range. Other examples where both sensors can be coupled to the readout circuit at the same time can include differential sensors, including a first capacitive sensor and a second resistive sensor. Still further examples where both sensors can be coupled to the readout circuit at the same time can include triggered sensors, whose function is to change state in response to an input. Linear sensors can be used as well, but the output of the readout circuit will be a product of the two sensors outputs that may have use in a particular implementation.

Figure 4:
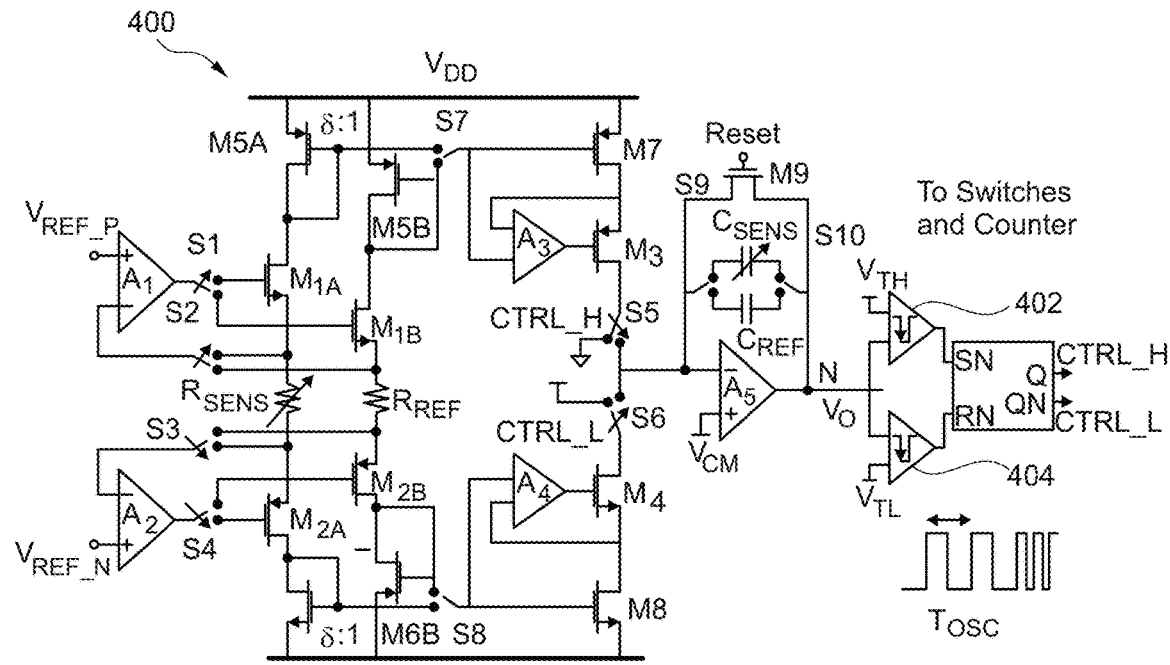
FIG. 4 is a schematic diagram of a substantially analog portion of a readout circuit according to an embodiment.

FIG. 4 shows a schematic of a possible implementation of the architecture of a readout circuit, according to an embodiment. Circuit 400 includes a voltage-to-current (V2I) converter, where two OPAMPs A1 and A2 and transistors $M_{1A}/M_{2A}$ provide a biasing voltage across sensing resistance, $R_{SENS}$, using two stable reference and bias voltages $V_{REF\_P}$ and $V_{REF\_N}$. The two OPAMPs A1 and A2 and transistors $M_{1B}/M_{2B}$ provide a biasing voltage across reference resistance, $R_{REF}$, using the two stable reference and bias voltages $V_{REF\_P}$ and $V_{REF\_N}$. Switches S1, S2, S3, and S4 couple the sensor resistor $R_{SENS}$ to the sources of transistors $M_{1A}$ and $M_{2A}$ in a first position, and couple the reference resistor $R_{REF}$ to the sources of transistors $M_{1B}$ and $M_{2B}$ in a second position. The feedback and source follower structure shown in FIG. 4 guarantees low output resistance at all buffered nodes (source of transistor $M_{1A}$, source of transistor $M_{2A}$, source of transistor $M_{1B}$, and source of transistor $M_{2B}$). The stable biasing at both sensing resistor $R_{SENS}$ terminals ensures a better stability of the sensor and isolates it from ground and supply voltages. A signal current $I_{SENS}=(V_{REF\_P}-V_{REF\_N})/R_{SENS}$ is then mirrored and alternatively sunk from or sourced in a virtual ground of an integrator including OPAMP $A_5$, according to control signals CTRL_H and CTRL_L. These control signals direct switches $S_5$ and $S_6$. In a first position the drain of transistor $M_3$ is coupled to the input of OPAMP $A_5$, and the drain of transistor $M_4$ is coupled to $V_{DD}$. In a second position the drain of transistor $M_4$ is coupled to the input of OPAMP $A_5$, and the drain of transistor $M_3$ is coupled to ground.

Switches $S_9$ and $S_{10}$ are used to couple either the capacitive sensor $C_{SENSE}$ of the capacitive reference to OPAMP $A_5$. A reset transistor $M_9$ receives a Reset control signal and the source and drain nodes of transistor $M_9$ are coupled between the negative input and output $V_O$ of OPAMP $A_5$. The positive input of OPAMP $A_5$ is coupled to a common mode voltage $V_{CM}$.

Switch $S_7$ is used to form a first current mirror with transistors $M_{5A}$ and $M_7$ in a first position, and is used to form a second current mirror with transistors $M_{5B}$ and $M_7$ in a second position. Both current mirrors have a ratio of δ as shown. Similarly, switch $S_8$ is used to form a first current with transistors $M_{6A}$ and $M_8$ in a first position, and is used to form a second current with transistors $M_{6B}$ and $M_8$ in a second position. Both current mirrors have a ratio of δ as shown. The current mirrors formed with transistor $M_7$ include an output resistance boosting circuit using OPAMP $A_3$ and transistor $M_3$, as will be explained in further detail below. The current mirrors formed with transistor $M_8$ include an output resistance boosting circuit using OPAMP $A_4$ and transistor $M_4$, as will be explained in further detail below.

At the output of the integrator including OPAMP $A_5$, the voltage $V_O$ is a triangular waveform that is compared to two reference voltages ($V_{TH}$ and $V_{TL}$) to generate switch control signals and to steer current. A first comparator 402 receives the $V_O$ triangular output voltage and the $V_{TH}$ reference voltage to generate a first variable frequency output voltage that is coupled to the SN input of latch 406. A second comparator 404 receives the $V_O$ triangular output voltage and the $V_{TL}$ reference voltage to generate a second variable frequency output voltage that is coupled to the RN input of latch 406. Latch 406 generates the CTRL_H control signal at the Q output and the CTRL_L control signal at the QN output as shown. The presence of an additional latch 406 always guarantees the synchronized switching of comparators. A variable frequency output signal having a period $T_{OSC}$ in a particular time period is shown in FIG. 4. The variable frequency output of the circuit 400 shown in FIG. 4 is at the Q or QN output of latch 406.

The output period waveform is proportional to the sensor resistance value according to the following expression:

$$T_{OSC} = \frac{2C_{REF} \cdot \Delta V \cdot R_{SENS}}{\delta \cdot V_{REF}} \quad [1]$$

Where $\Delta V = V_{TH} - V_{TL}$ is the input switching window of comparators 402 and 404 and $\delta$ is the current ratio of the current mirrors including transistors $M_7$ and $M_8$ as previously discussed. The digital conversion of the variable frequency output signal to a serial data bit stream is performed by counting how many oscillations occur in a precisely defined time window, as will be discussed in further detail below with respect in particular to the description of FIG. 6.

Equation [1] was used to measure the resistance value of a resistive sensor. By inverting the roles of R and C in the above equation it is possible to use the same architecture to measure an unknown capacitor value in a capacitive sensor. In the resistance-to-frequency conversion of equation [1] the unknown parameter is $R_{SENS}$, and the capacitance value is fixed. In the capacitance-to-frequency conversion of equation [2] a reference resistor $R_{REF}$ is used to generate a constant current $I_{SENS}$ to be integrated in the sensor capacitance $C_{SENS}$ leading to an oscillation frequency proportional to $C_{SENS}$ itself:

$$T_{OSC} = \frac{2C_{SENS} \cdot \Delta V \cdot R_{REF}}{\delta \cdot V_{REF}} \quad [2]$$

The interface can be adapted to convert a matrix of resistive sensors by having the multiplexing switches working on high impedance nodes as shown in FIG. 4, avoiding the introduction of parasitic resistances that can cause additional errors in the measurement. Alternatively, the interface can be adapted to convert a matrix of capacitive sensors by having the multiplexing switches or a combination of resistive and capacitive sensors. Switches S1 through S8 can be used to provide a multiplexing function, or can be set in a fixed position that might be required to accommodate a single sensor in an application. It will be apparent to those skilled in the art that a multiplicity of sensors can be used in a multiplexing mode of operation, but will result in a multiplexed data output stream, wherein only a periodic portion of the data output stream will be associated with an individual capacitive or resistive sensor.

Current mirrors have to maintain a very high linearity for a very wide range of currents due to the large variations in the resistance value of $R_{SENS}$. Choosing regulated cascoded topologies for the mirrors is then strongly advised and OPAMPs A3 and A4 should have sufficiently high gain to boost each current mirror's output impedance. To better fit operative point constraints OPAMP A3 uses a p-input topology while OPAMP A4 uses a complementary n-input topology.

Transistors $M_{1A}$, $M_{1B}$, $M_{2A}$, and $M_{2B}$ ideally have a very large W/L ratio to keep their overdrive low and to avoid saturation of the outputs of amplifier $A_1$ and $A_2$ in high $I_{SENS}$ conditions. Transistors $M_3$ and $M_4$ ideally ensure that the outputs of OPAMPs A3 and A4 are always sufficiently separated from $V_{DD}$ and GND, and thus they have a much lower W/L ratio.

The value of $R_{REF}$ used to evaluate $C_{SENS}$ should be chosen to have the current mirrors working with a constant current in their best nominal operative point to ensure the best linearity response in all conditions.

Integrator OPAMP (A5) and comparators 402 and 404 shown ideally be fast enough to cope with a maximum oscillation frequency. The comparators input switching window $\Delta V$ should be as large as possible to lower the comparators' offset impact on output resolution.

Figure 5:
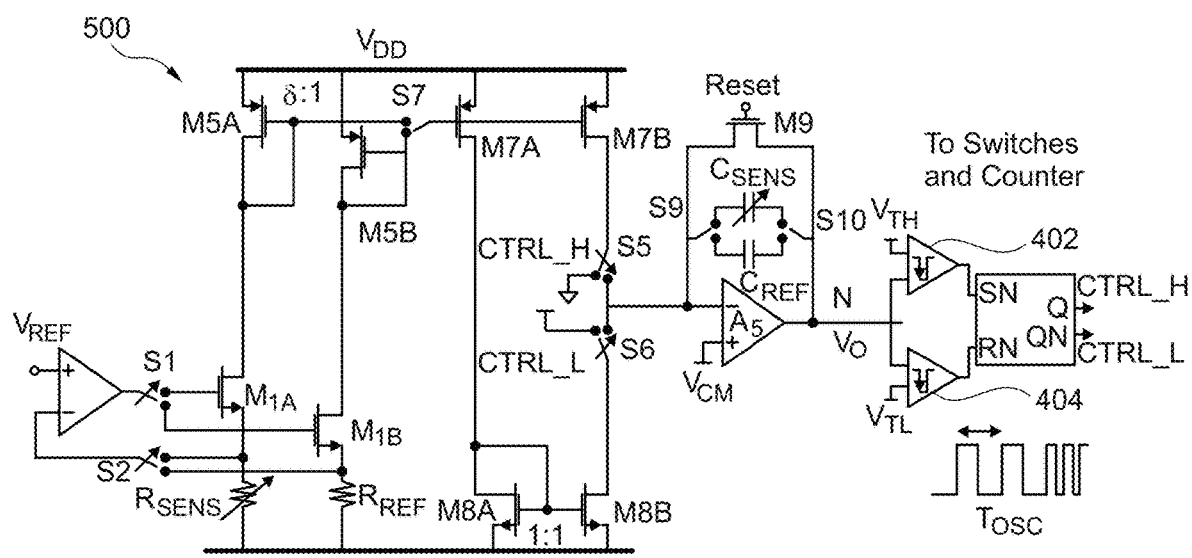
FIG. 5 is a schematic diagram of a substantially analog portion of a readout circuit according to another embodiment.

A similar implementation to that of FIG. 4 is shown in FIG. 5. In the circuit 500 shown in FIG. 5 only one terminal of the resistive sensing element is available, and the V2I converter provides biasing between the available terminal and ground.

Thus, FIG. 5 shows a schematic of a possible implementation of the architecture of a readout circuit, according to another embodiment. Circuit 500 includes a voltage-to-current (V2I) converter, where a single OPAMP A1 and transistors $M_{1A}$ provides a biasing voltage across sensing resistance, $R_{SENS}$, using a stable reference and bias voltages $V_{REF}$. The single OPAMP A1 and transistors $M_{1B}$ provides a biasing voltage across reference resistance, $R_{REF}$, using a single stable reference and bias voltages $V_{REF}$. Both the resistive sensor $R_{SENS}$ and the resistive reference resistance $R_{REF}$ are coupled to ground. Switches S1 and S2 couple the sensor resistor $R_{SENS}$ to the source of transistors $M_{1A}$ in a first position, and couple the reference resistor $R_{REF}$ to the source of transistors $M_{1B}$ in a second position. The feedback and source follower structure shown in FIG. 5 guarantees a low output resistance at the source of transistor $M_{1A}$ and the source of transistor $M_{2A}$. A signal current $I_{SENS} = V_{REF}/R_{SENS}$ is then mirrored and alternatively sunk from or sourced in a virtual ground of an integrator including OPAMP $A_5$, according to control signals CTRL_H and CTRL_L. These control signals direct switches $S_5$ and $S_6$. In a first position the drain of transistor $M_{7B}$ is coupled to the input of OPAMP $A_5$, and the drain of transistor $M_{8B}$ is coupled to $V_{DD}$. In a second position the drain of transistor $M_{8B}$ is coupled to the input of OPAMP $A_5$, and the drain of transistor $M_{7B}$ is coupled to ground.

Switch $S_7$ is used to form a first dual output current mirror with transistors $M_{5A}$ and $M_{7A}$ and $M_{7B}$ in a first position, and is used to form a second dual output current mirror with transistors $M_{5B}$ and $M_{7A}$ and $M_{7B}$ in a second position. Both current mirrors have a ratio of $\delta$ as shown.

The remaining circuitry in FIG. 5 relates to the integration circuit and the triangle wave to variable frequency output signal conversion previously described.

Figure 6:
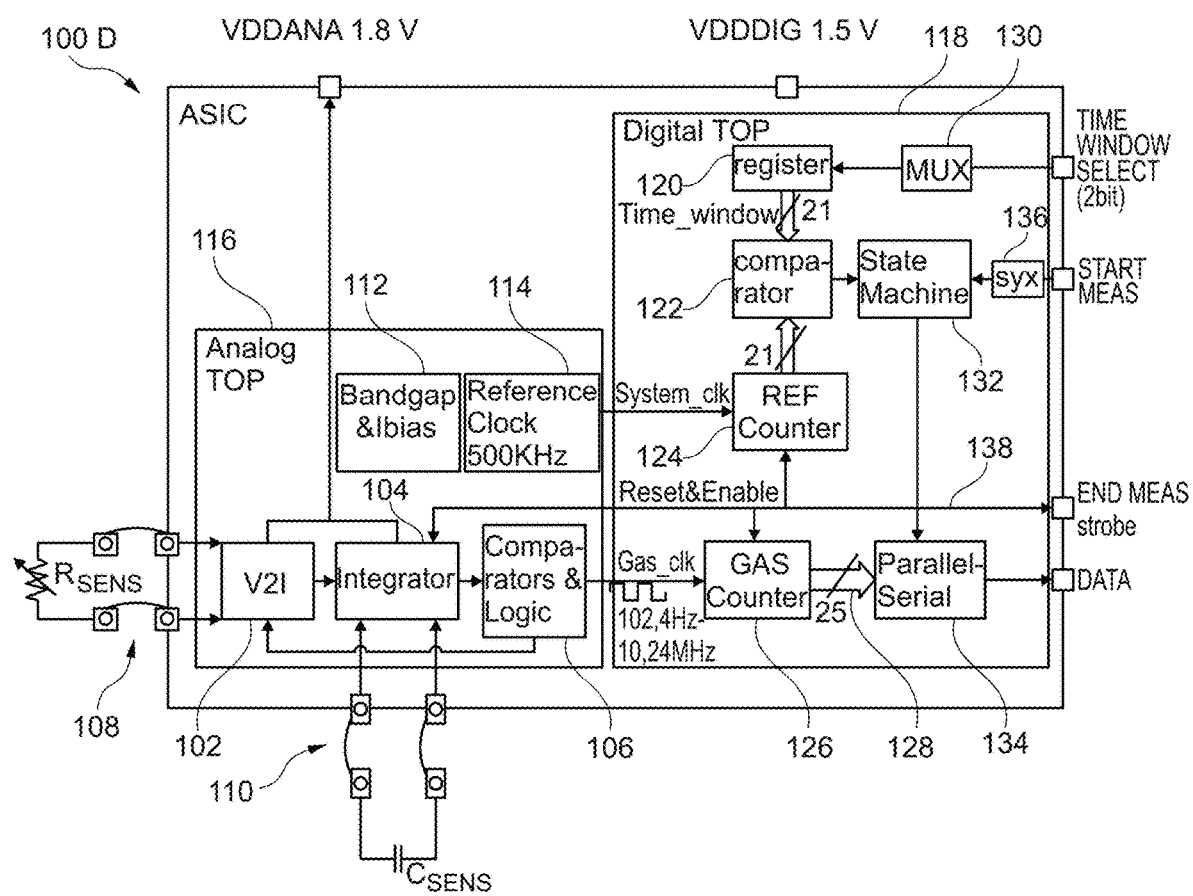
FIG. 6 is a block diagram of an ASIC integrated circuit according to another embodiment illustrating analog and digital portions, according to an embodiment.
Figure 7:
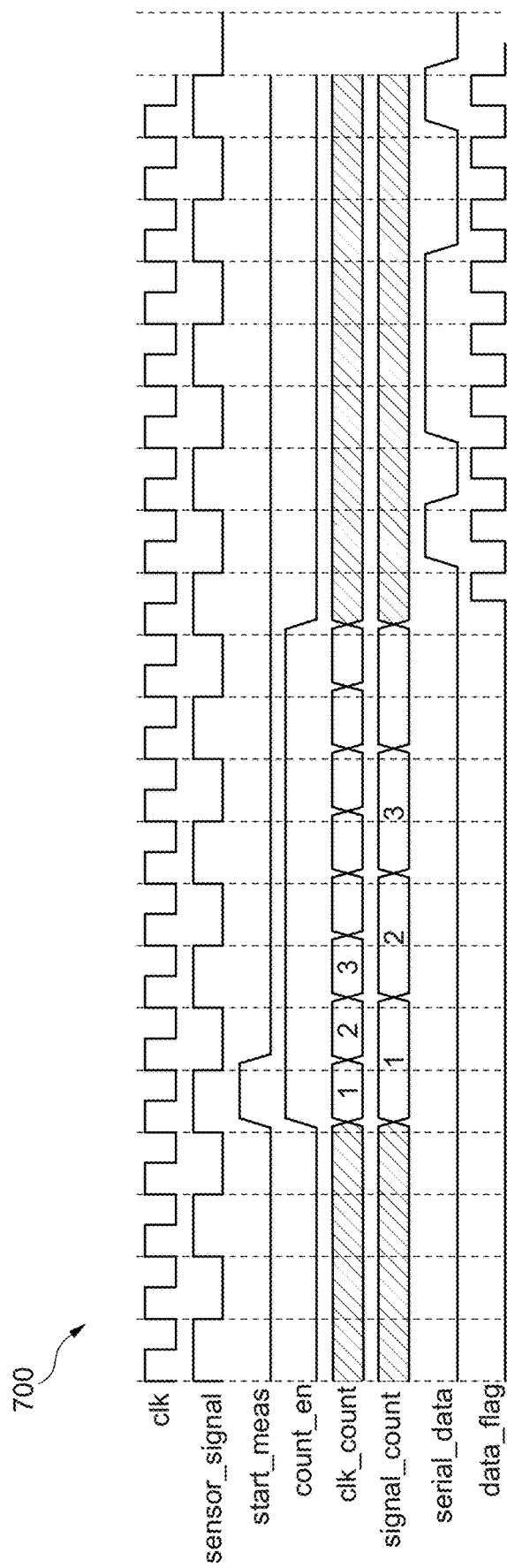
FIG. 7 is a timing diagram associated with the ASIC integrated circuit of FIG. 6.

An ASIC 100D is shown in FIG. 6 in greater detail than previously described, showing a substantially analog section 116 and a digital section 118 that includes, in part, a frequency-to-serial-data converter. The analog section 116 is substantially as previously described including the V2I converter 102, the integrator 104, and the comparator section 106. Also shown in the analog section 116 is a two node input 108 for receiving input from a resistive sensor, and a two node input 110 for receiving input from a reference capacitor in an embodiment. A reference internal clock 114 is used to generate a time window (used as a base for the sensor measurements.) Also shown is a bandgap circuit 112 for generating the voltage and current references used.

The digital section 118 converts the frequency of the triangular wave signal at the output of the integrator into a digit which can be communicated at the ASIC output, with a single bit interface. In pertinent part, the number of rising/falling edges of the wave at the output of the integrator in a reference stable time window are counted. The digital section 118 includes a register 120, a comparator 122, a reference counter 124, and a GAS counter 126 having an output bus 128. Also shown in digital section 118 are a multiplexer 130, a state machine 132, and a parallel-to-serial converter 134. A reset and enable bus is coupled to the integrator 104, GAS counter 126, reference counter 124, state machine 132, and parallel-to-serial converter 134, and brought out to a strobe pin as shown.

Pins on the ASIC 100D include, but are not limited to, an analog supply voltage VDDANA, a digital supply voltage VDDDIG, a two-bit time window select, a start measurement, and end measurement strobe, a data output, and two node inputs 108 and 110.

Referring to the timing diagram of FIG. 6, a waveform diagram shows the following signals: clk, sensor_signal, start_meas, count_en, clk_count, signal_count, serial_data, and data_flag.

The "clk" signal is the internal 500 KHz clock signal previously described.

The "sensor_signal" is the output of a capacitive or resistive signal.

The "start_meas" signal is a pulse that begins a measurement cycle.

The "count_en" is a signal that goes high when the clock cycles and sensor signal cycles are being counted.

The "clk_count" signal shows the count progression of the number of clock signals being counted.

The "signal_count" signal counts the rising/falling (depending on the implementation but this is not relevant) edges of the voltage signal generated at the output of the integrator and squared with a comparator.

The "serial_data" signal is sell explanatory and refers to the serial data provided at an output pin to the user, multiplexing one or more resistive and/or capacitive sensors.

The resolution of the serial data provided by ASIC 100D depends on time window duration and clock frequency. The resolution will be improved, generally speaking, with a longer window duration and a higher clock frequency.

Figure 8:
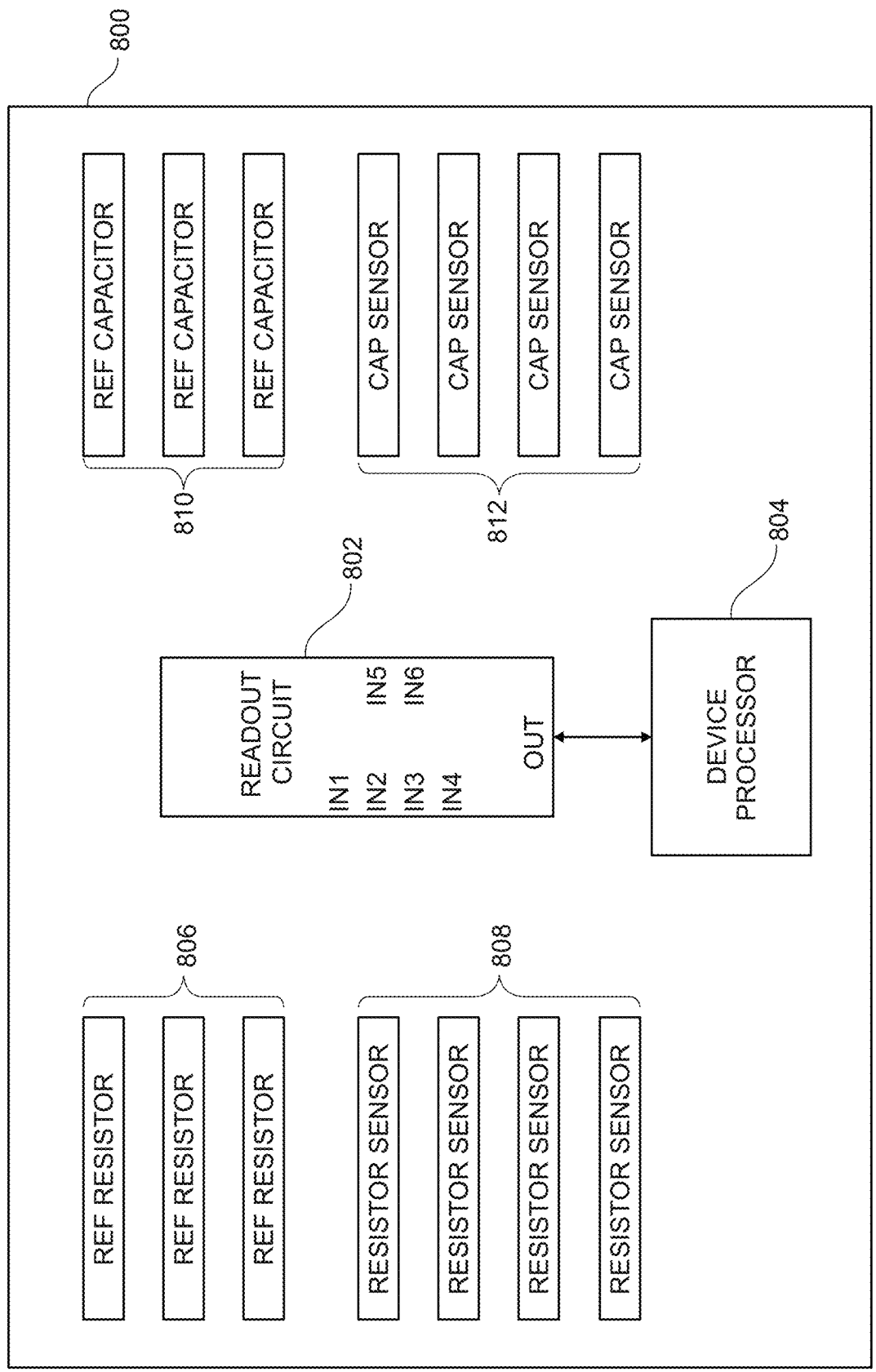
FIG. 8 shows an integrated readout circuit embodiment resident in a device.

FIG. 8 shows in block diagram form, a device 800, such as a cell phone, wherein an integrated readout circuit 802 interacts with a plurality of external resistive references 806, resistive sensors 808, capacitive references 810, and capacitive sensors 812. A device processor 804 is also shown for interacting with readout circuit 802 and for controlling the availability of the references and sensors. In FIG. 8, the sensors and references would be integrated together on the same integrated circuit 802, or external to the integrated circuit 802 but resident on the device 800, or a combination of the two. The six inputs shown in readout circuit 802 could correspond to the circuit 400 of FIG. 4 in an embodiment as follows: IN1 source of transistor $M_{1A}$, IN2 source of transistor $M_{2A}$, IN3 source of transistor $M_{1B}$, IN4 source of transistor $M_{2B}$, IN5 negative input of OPAMP A5, and IN6 output of OPAMP A6.

In a first mode of operation, one of the reference resistors 806 and one of the capacitive sensors 812 could be selected and coupled to the appropriate inputs of circuit 400. In a second mode of operation, one of the reference capacitors 810 and one of the resistive sensors 808 could be selected and coupled to the appropriate inputs of circuit 400. In a third mode of operation, one of the resistive sensors 808 and one of the capacitive sensors 812 could be selected and coupled to the appropriate inputs of circuit 400.

Circuit 400 can be configured in an embodiment to multiplex between two or all three modes of operation. Different sensors and references can also be selected from a plurality of sensors and references and multiplexed as desired. Other embodiments can be hardwired to fix operation in the first, second, or third mode operation if desired.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
a first input coupled to a reference resistor in a first mode of operation and coupled to a resistive sensor in a second mode of operation;
a second input coupled to a capacitive sensor in the first mode of operation and coupled to a reference capacitor in the second mode of operation;
an output for providing a capacitive sensor data stream in the first mode of operation and for providing a resistive sensor data stream in the second mode of operation; and
a voltage-to-current converter coupled to the first input,
wherein the voltage-to-current converter comprises an amplifier selectively coupled to a first current mirror portion in the first mode of operation and selectively coupled to a second current mirror portion different from the first current mirror portion in the second mode of operation by a switch directly coupled to an output of the amplifier,
wherein a third current mirror portion is selectively coupled to the first current mirror portion in the first mode of operation,
wherein the third current mirror portion is selectively coupled to the second current mirror portion in the second mode of operation, the first and third current mirror portions comprising a first current mirror in the first mode of operation, and the second and third current mirror portions comprising a second current mirror in the second mode of operation, and
wherein the first current mirror portion comprises an input transistor of the first current mirror, the second current mirror portion comprises an input transistor of the second current mirror, and the third current mirror portion comprises an output transistor of the first current mirror in the first mode of operation and of the second current mirror in the second mode of operation.

2. The circuit of claim 1, further comprising an integrator coupled to the voltage-to-current converter and the second input.

3. The circuit of claim 2, wherein the integrator comprises an amplifier coupled to first and second switches configured in a first position in the first mode of operation and configured in a second position in the second mode of operation.

4. The circuit of claim 2, further comprising a logic circuit coupled to the integrator and to the output.

5. The circuit of claim 4, wherein the logic circuit comprises a first comparator having a first threshold voltage coupled to a second comparator having a second threshold voltage.

6. An integrated circuit comprising:
a first input pin for coupling to a resistor;
a second input pin for coupling to a capacitor;
an output pin configured to provide a data stream corresponding to a value of the capacitor in a first mode of operation and for providing a data stream corresponding to a value of the resistor in a second mode of operation; and
a voltage-to-current converter coupled to the first input,
wherein the voltage-to-current converter comprises an amplifier selectively coupled to a first current mirror portion in the first mode of operation and selectively coupled to a second current mirror portion different from the first current mirror portion in the second mode of operation by a switch directly coupled to an output of the amplifier,
wherein a third current mirror portion is selectively coupled to the first current mirror portion in the first mode of operation,
wherein the third current mirror portion is selectively coupled to the second current mirror portion in the second mode of operation, the first and third current mirror portions comprising a first current mirror in the first mode of operation, and the second and third current mirror portions comprising a second current mirror in the second mode of operation, and
wherein the first current mirror portion comprises an input transistor of the first current mirror, the second current mirror portion comprises an input transistor of the second current mirror, and the third current mirror portion comprises an output transistor of the first current mirror in the first mode of operation and of the second current mirror in the second mode of operation.

7. The circuit of claim 6, further comprising an integrator coupled to the voltage-to-current converter and the second input.

8. The circuit of claim 7, wherein the integrator comprises an amplifier coupled to first and second switches configured in a first position in the first mode of operation and configured in a second position in the second mode of operation.

9. The circuit of claim 7, further comprising a logic circuit coupled to the integrator and to the output.

10. The circuit of claim 9, wherein the logic circuit comprises a first comparator having a first threshold voltage coupled to a second comparator having a second threshold voltage.

* * * * *